United States Patent
Mase et al.

(10) Patent No.: US 8,049,136 B2
(45) Date of Patent: Nov. 1, 2011

(54) METHOD FOR PRODUCING METAL MASK FOR SCREEN PRINTING

(75) Inventors: Keiji Mase, Tokyo (JP); Shozo Ishibashi, Tokyo (JP)

(73) Assignee: Fuji Manufacturing Co., Ltd., Tokyo (JP)

( * ) Notice: Subject to any disclaimer, the term of this patent is extended or adjusted under 35 U.S.C. 154(b) by 776 days.

(21) Appl. No.: 12/173,970

(22) Filed: Jul. 16, 2008

(65) Prior Publication Data
US 2009/0032507 A1    Feb. 5, 2009

(30) Foreign Application Priority Data
Aug. 3, 2007   (JP) .................. 2007-203418

(51) Int. Cl.
B23K 26/16   (2006.01)
B24C 1/00    (2006.01)
B24C 11/00   (2006.01)

(52) U.S. Cl. ............... 219/121.71; 219/121.85; 451/39; 451/526

(58) Field of Classification Search ............ 219/121.67, 219/121.7–121.72, 121.85; 451/39, 330, 451/526
See application file for complete search history.

(56) References Cited

U.S. PATENT DOCUMENTS
5,181,379 A * 1/1993 Wakeman et al. ............ 60/766
5,816,902 A * 10/1998 Watanabe et al. ............ 451/532
2006/0099888 A1   5/2006 Ishibashi et al.

FOREIGN PATENT DOCUMENTS
| JP | 2957492 B2 | 7/1999 |
| JP | 31060084 B2 | 2/2001 |
| JP | 2001207160 A | 7/2001 |
| JP | 2006159402 A | 6/2006 |

* cited by examiner

Primary Examiner — Samuel M Heinrich
(74) Attorney, Agent, or Firm — Porzio, Bromberg & Newman, P.C.

(57) ABSTRACT

A method for producing a metal mask for screen printing is provided, in which dross that is deposited at the time a boring operation is conducted via a laser beam is removed, without causing warpage or bending. The method for producing a metal mask for screen printing includes steps of: forming openings in the metal plate by melting the metal plate at positions irradiated by the laser beam; and ejecting an abrasive onto the other surface of the metal plate after the openings are formed. The abrasive ejected in the abrasive ejection step is one having a predetermined flat shape (plate-shaped abrasive), so as to form a plate shape having a flat surface, or an elastically deformable abrasive, with an average grain diameter of a dispersed or carried abrasive grain being 1 mm to 0.1 μm, and which is ejected at an incident angle of equal to or less than 80 degrees with respect to the other surface of the metal plate, and at an ejection pressure of 0.01 MPa to 0.7 MPa or at an ejection speed of 5 m/sec to 150 m/sec, so as to slide along the other surface of the metal plate.

17 Claims, 3 Drawing Sheets

METHOD FOR PRODUCING METAL MASK FOR SCREEN PRINTING

BACKGROUND OF THE INVENTION

1. Field of the Invention

The present invention relates to a method for producing a metal mask for screen printing. More specifically, the present invention relates to a method for producing a metal mask for screen printing that includes steps of: forming opening portions for printing (hereinafter referred to as "opening") via laser irradiation, and removing dross (burrs) deposited by the opening forming process.

2. Description of the Related Art

A "metal mask" formed with a pattern of openings that corresponds to the printing pattern on a metal plate such as stainless steel is employed in fields that require relatively detailed printing, such as solder paste printing or photoresist layering during a method for producing printed circuits, IC substrates, etc. Accordingly, when such a metal mask abuts the surface of the product to be treated, and a solder paste or ink paste is applied from the opposing surface with a squeegee, etc., printing is performed on the surface of the product to be printed with the paste, corresponding to the pattern of openings.

A metal mask employed in this type of screen printing is formed with openings that correspond to the printing pattern of the abovementioned metal plate. Accordingly, various conventional etching technologies may be employed as the method for forming this type of pattern of openings, such as melting by laser irradiation, electrolytic polishing, etching by chemicals, etc. However, with the current popularization of CAD and CAM, by controlling the trajectory of laser irradiation in accordance with a predesigned predetermined print pattern, via computer numerical control (CNC) that employs CAD data, etc., even complicated patterns of openings can be processed relatively easily. Accordingly, operations for forming the above-described openings via laser irradiation have been frequently employed in recent years.

However, in this type of opening formation via laser irradiation, the openings are formed by melting the metal plate at the positions of laser irradiation. Accordingly, a portion of the metal melted by laser irradiation is attached and hardened at an edge of an opening on the surface of the metal plate on the opposite side from the side that was irradiated, and the raised edge portions of the openings where burrs arise are referred to as the portions where "dross" is deposited (refer to FIG. 2).

Therefore, when a metal mask with dross deposits like this is employed in screen printing and the dross deposited surface thereof is employed as the surface to be in close contact with the product to be printed, the metal mask cannot be brought into close contact with the surface of the product to be printed. As a result, because of the space arising between the metal mask and the surface of the product to be printed, detailed printing cannot be conducted. Conversely, when the dross deposited surface is positioned on a side opposite to that of the surface to be printed, the inflow of the paste into the inside of the openings is inhibited by the dross, so that an accurate amount of solder paste or ink paste cannot be supplied.

Accordingly, when boring a metal mask via this type of laser irradiation, an operation for removing this dross is conducted after the openings are formed by laser irradiation.

However, one method for removing these dross deposits involves, for example, etching the surface of a metal mask by being immersed in a chemical such as ferric chloride, etc., or electro-polishing the surface, with a metal mask placed in an electro-polishing solution.

However, when the abovementioned method is employed, not only are the dross deposits removed, but the edge portions surrounding the openings formed in the metal mask are also etched and polished. Accordingly, because the post-processed openings become larger at the front and rear surfaces, and the hole diameter in the center portion is formed into a narrowed drum shape (bilaterally symmetrical conical notch), the narrowed central portion presents resistance against the passage of solder paste or ink paste through the openings, which impedes the supply of solder paste or ink paste.

Moreover, because the diameters are enlarged by etching the edges of the openings, the actual printed shape becomes larges than the intended printing shape. As a result, even if the openings are formed into a shape with corners, for example, a planar rectangular shape, etc., because these corners are removed by etching, etc., and formed into a rounded shape, the printing of an extremely detailed shape cannot be performed, so that the quality of the printing is decreased.

In addition, when performing the elimination of dross deposited by electro-polishing or chemical etching, a chemical such as an electro-polishing solution or an etching solution is employed. Accordingly, when these chemicals are directly disposed of, etc., they cause considerable stress on the environment.

In such cases, a treatment is required to detoxify these chemicals before disposal, with the expenses required for this treatment being passed on to the cost of the metal mask itself, which in turn increases the production cost.

Thus, in recent years, conversion from a chemical treatment that employs chemicals, etc., to a dry-type treatment that does not employ chemicals, etc., has been sought.

As a method for performing dross removal via such a dry-type treatment, a method for producing a metal mask is provided whereby the surface of the metal plate is ground by sandblasting after a predetermined pattern of openings is formed by laser irradiation (refer to Japanese Patent No. 3160084).

Moreover, in the metal mask production method described in the abovementioned Japanese Patent No. 3160084, the sandblasting is intended not only to remove the deposited dross, but also to provide a satin-like finish to the surface of the metal mask (refer to paragraph [0014] of the abovementioned Japanese Patent No. 3160084). Unlike this method, however, a method has also been proposed whereby, rather than forming a satin-like finish, a glossy or mirror-like finish is provided on the surface of the product to be treated via the ejection of an abrasive. As the abrasive for providing this glossy or mirror-like finish to the product to be treated, an elastic abrasive is provided in which abrasive grains are supported on the surface of a core consisting of an elastic body, or the abrasive grains are dispersed by being kneaded into the core consisting of the elastic body, etc. (Japanese Unexamined Patent Application Publication No. 2006-159402; Japanese Unexamined Patent Application Publication No. 2001-207160; and Japanese Patent No. 2957492).

PROBLEMS OF THE RELATED ARTS

In the invention disclosed in the abovementioned Japanese Patent No. 3160084, the abrasive is bombarded onto the metal plate together with compressed air etc. via sandblasting. Thus, the surface thereof is cut via the cutting force of the abrasive at the time of the abovementioned bombardment, to thereby allow for the removal of the dross deposits and for a satin-like finished surface to be provided. As a result, because the removal of dross and the subsequent satin-like finished surface can be accomplished via a dry-type treatment, without employing any chemicals, etc., there is very little stress on the environment.

However, as indicated below, there are several disadvantages when removing dross or providing a satin-like finished surface via this type of sandblasting.

Moreover, the "sandblasting" disclosed in Japanese Patent No. 3160084 refers to "sandblasting" as described in "The Dictionary of Mechanical Engineering", published by Asakura Publishing Co., Ltd., wherein "sandblasting is an operation whereby sand is blown onto the surface of the product to be treated at high speed via atmospheric pressure, in order to clean affixed articles on the surface off the product"; in addition to sand, blowing abrasive grains may also be referred to as "sandblasting".

Occurrence of Bending

When the dross is being removed or the satin-like finish is being provided by sandblasting, the sandblasting is conducted on the surface where dross has been deposited or on the surface on which the satin-like finished is to be provided. However, this type of sandblasting cuts the metal plate, by bombarding abrasive grains ejected at a high speed onto the metal plate forming the metal mask. As a result, when the surface of the metal plate bombarded has a large amount of force applied thereto via this bombardment, it simultaneously causes plastic deformation of the surface of the product to be treated.

Accordingly, a compression force is applied to the surface of this metal plate, causing bending, so that the surface of the post-processed metal plate onto which the abrasive grains are bombarded is expanded.

As a countermeasure against this type of bending, the sandblasting treatment must also be similarly conducted on the surface of the metal plate on the side opposite to that of the surface to be treated, so that the compressive force is uniformly applied to both surfaces, and the bending thereof is corrected. However, when the bending is corrected in this manner, the sandblasting treatment must be consistently conducted on each of the front and back surfaces of the metal plate, so that a total of two sandblasting treatments are required, which thereby increases the cost of production as a result of an increased number of production steps.

In addition, because it is difficult to uniformly apply a compressive force to both surfaces, warpage occurs in the metal plate (metal mask) after the bending is corrected, which in turn reduces the printing quality.

Moreover, when the surface to be treated is a relatively thin metal foil (for example, in the range of 10 μm to 500 μm), the recessed deformations from the sandblasting process become larger, so that processing becomes difficult.

Metal Mask Damage

Furthermore, when the metal mask is formed of a plate-shaped metal plate having a relatively thin film thickness, or a metal foil (10 μm to 100 μm), and sandblasting is conducted on this metal plate or foil, the metal substrate bombarded with the abrasive may be damaged by the kinetic energy of the abrasive.

Occurrence of Flaws in the Surface of the Metal Mask

In addition, the objective of the above-described sandblasting is to enhance cutting performance. As a result, alumina, silicon carbide, etc. abrasive grains are employed because of the irregularly protruded shape, and the relative degree of hardness of the metal plate. However, when the satin-like finish formed on the surface of the product to be treated after being bombarded with this type of abrasive grain is microscopically observed, countless sharply shaped irregularities are formed in response to the shape of these abrasive grains.

Once the solder paste or the ink paste intrudes into the irregularities formed in the surface of a metal mask sandblasted in this manner, since it cannot be removed, the solder paste or ink paste remains within the irregularities, causing degradation, a change in properties, or hardening thereof etc.

In addition, when the solder paste or ink paste with such a degradation, a change in properties, or hardening thereof, etc., is stripped from the inside of the irregularities by repeatedly employing a metal mask, it is incorporated into the newly supplied solder paste or ink paste and is applied to the product to be treated, so that the printing quality thereof is decreased.

Abrasive Penetration into the Surface of the Metal Mask

Moreover, the material of the metal mask is a metal, and therefore, abrasive grains with a high degree of hardness relative to the hardness of the metal material are employed as the abrasive for removing the dross deposited on this metal mask and providing the satin-like finish thereto, so as to enable cutting of this metal. Accordingly, because the above-described abrasive grains are employed on the irregularly cornered shape, when these abrasive grains are bombarded onto the surface of the metal mask, a portion of the abrasive grains penetrates into the metal mask and becomes embedded therein.

The abrasive grains embedded in the surface of the metal mask in this manner cause the solder paste or ink paste in the portions where these abrasive grains are embedded to be repelled, etc., due to differences in the wettability of the solder paste or ink paste and that of the metal material constituting the metal mask, so that a uniform amount of solder paste or ink paste cannot be supplied or applied. As a result, the printing quality thereof is inferior, so that detailed printing, etc. cannot be performed.

Grinding the Edges of the Openings

Moreover, when abrasive grains are ejected at high speed onto the surface of the metal mask by sandblasting, these ejected abrasive grains cause a phenomenon called "sagging", in which not only is the dross removed, but the edge portions of the openings of the holes formed in the metal mask are also cut, so that the openings of the holes are thereby enlarged.

Accordingly, the actually printing size with respect to a pre-configured printing design is enlarged, so that the printing quality is inferior.

Elastic abrasive (Japanese Unexamined Patent Application Publication No. 2006-159402; Japanese Unexamined Patent Application Publication No. 2001-207160; and Japanese Patent No. 2957492)

Moreover, in the sandblasting conducted after the formation of the openings via laser irradiation in the production method for the metal mask illustrated in the above-described Japanese Patent No. 3160084, the objective is not just to remove the above-described dross, but also to provide a satin-like finish to the surface of the metal mask. However, the elastic abrasives described in the above-described three Related Art descriptions are all inventions for providing a mirror-like finish or a glossy-like finish, rather than providing a satin-like finish to the surface product to be treated. Accordingly, if this is applied to the production of a metal mask, the objective of providing the metal mask with a satin-like finish cannot be achieved by the invention disclosed in Japanese Patent No. 3160084. Moreover, the improvements in the printing quality achieved from forming a satin-like finish cannot be obtained in the metal mask produced by the method described in Japanese Patent No. 3160084.

The present invention aims to eliminate the disadvantages in the abovementioned Related Art. Specifically, an object of the present invention is to provide a method for producing a metal mask that allows for even more finely detailed printing by further resolving the problems associated with the invention described in Japanese Patent No. 3160084, which provides the sandblasting treatment process described above, while still providing the above-described advantages of the invention described in Japanese Patent No. 3160084, which is a method of treating a metal plate after forming openings therein by irradiation with laser light, namely, the ability to reduce environmental stress and to produce a metal mask at low cost, without requiring treatment with chemicals such as those required for the abovementioned electro-polishing or chemical polishing.

SUMMARY OF THE INVENTION

In the following explanation of the Summary, reference numerals are referred as of the Embodiment in order to easily read the present invention, however, these numerals are not intended to restrict the invention as of the Embodiment.

To achieve the above object, a method for producing a metal mask for screen printing according to the present invention, is characterized by comprising the steps of:

forming an opening by irradiating a laser beam at predetermined positions on a surface at one side of a metal plate, such that the metal plate is melted at positions irradiated by the laser beam, to form openings passing through a thickness of the metal plate; and ejecting an abrasive onto the other surface of the metal plate after the openings are formed, wherein the abrasive ejected in the step of ejecting the abrasive is formed into a plate shape having a flat surface, with a maximum diameter of the flat surface thereof being in a range of 0.05 mm to 10 mm, and 1.5 to 20 times as a thickness of a flat shape thereof, and the abrasive with the flat shape is ejected at an incident angle of equal to or less than 80 degrees with respect to the other surface of the metal plate, and, at an ejection pressure of 0.01 MPa to 0.7 MPa or at an ejection speed of 5 m/sec to 150 m/sec, such that the ejected abrasive is slid along the other surface of the metal plate.

In the method for producing a metal mask for screen printing, the abrasive may comprise a plate-shaped carrier having flat surfaces, and an abrasive grain carried on at least one of the flat surfaces of the carrier.

In this case, the carrier of the abrasive may be paper. The abrasive grain carried on the carrier via an adhesive may be used.

The abrasive may comprise a carrier formed into a plate shape having flat surfaces, and the abrasive grain dispersed within the carrier.

As described above, when the abrasive employed is one provided with a carrier, this carrier may be constructed of an elastic body, or may be formed as an abrasive capable of elastic deformation.

Further, in the method, the surface of the metal plate may be cut in a stripe shape by the abrasive grain carried on the abrasive, via the sliding of the abrasive along the surface of the metal plate, to form a desired surface roughness on the surface of the metal plate from an accumulation of the stripe-shaped cutting indentations.

Moreover, a method for producing a metal mask for screen printing, comprising the steps of:

forming an opening by irradiating a laser beam at predetermined positions on a surface at one side of a metal plate, such that the metal plate is melted at positions irradiated by the laser beam, and to form openings passing through a thickness of the metal plate; and ejecting an abrasive onto the other surface of the metal plate after the openings are formed, wherein the abrasive ejected in the step of ejecting the abrasive is an elastically deformable abrasive in which an abrasive grain having an average grain diameter of 1 mm to 0.1 μm is dispersed or carried, and the elastically deformable abrasive (hereinafter referred to as "elastic abrasive") is ejected at an incident angle of equal to or less than 80 degrees with respect to the other surface of the metal plate, and at an ejection pressure of 0.01 MPa to 0.7 MPa or at an ejection speed of 5 m/sec to 150 m/sec, such that the ejected abrasive is slid along the other surface of the metal plate.

In the method for producing a metal mask for screen printing, the surface of the metal plate may be cut in a stripe shape by the abrasive grain dispersed in or carried on the abrasive, via the sliding of the abrasive along the surface of the metal plate, to form a desired surface roughness on the surface of the metal plate from an accumulation of the stripe-shaped cutting indentations.

In the method for producing a metal mask for screen printing, the abrasive grain carried on the surface of the carrier, which is an elastic material, or dispersed within the carrier, which has elasticity may be used.

With the structure of the above-described present invention, a method for producing a metal mask of the present invention having the following remarkable effects can be obtained.

Bending does not occur in the metal mask even though an abrasive is ejected. It is thus possible to produce a metal mask from which dross is removed, without any warpage or bending, by ejecting the abrasive onto only one side of the metal mask (the dross deposited surface).

As a result, the number of production steps can be reduced relative to conventional production methods for metal masks, in which sandblasting must be performed on both sides of the metal mask. Accordingly, the cost of production is reduced via the decrease in the number of production steps and the decrease in the production time thereof.

Moreover, by producing a metal mask by the method of the present invention, metal mask deformation or damage, etc. during the dross removal process can be sufficiently prevented.

Furthermore, in the method for producing the metal mask of the present invention, there no sharply and uneven irregularities are formed on the surface of the metal mask, which thereby prevents the formation of irregularities into which the ink paste, etc. can intrude.

As a result, the problems in the abovementioned Related Art, such as the shedding of the hardened, altered, degraded, etc. ink paste that intrudes into these irregularities, and the subsequent incorporation thereof into freshly supplied ink paste, etc. can be solved, so that a reduction in the printing quality via the incorporation, etc. of hardened, altered, degraded, etc. ink paste can be prevented.

In the metal mask produced by the method of the present invention, because the ejected abrasive (abrasive grains constituting the abrasive) does not penetrate into the metal mask, partial changes in the wettability of the surface of the metal mask due to the difference in the wettability of the metal material constituting the metal mask and the abrasive penetrating thereinto can be prevented.

Moreover, because the edge portions of the openings are not cut during dross removal, and the subsequent enlargement of these openings is prevented, highly detailed printing can be achieved.

BRIEF DESCRIPTION OF THE DRAWINGS

The objects and advantages of the invention will become apparent from the following detailed description of preferred embodiments thereof provided in connection with the accompanying drawings in which.

DETAILED DESCRIPTION OF THE PREFERRED EMBODIMENTS

Figure 1:
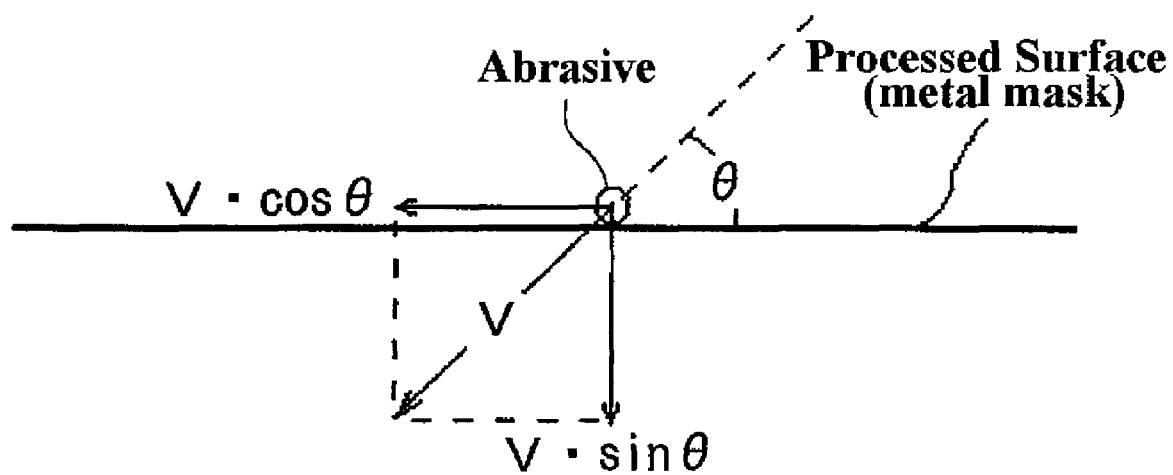
FIG. 1 is an explanatory view of components of forces acting on a metal mask at a bombarded position.

Hereinafter, the embodiments of the present invention will be explained below.

A method for producing a metal mask of the present invention includes the steps of: irradiating a laser beam onto a metal plate composing the metal mask, to form a predetermined pattern of openings passing through this metal plate in the thickness direction; and removing the dross (burrs) deposited on edges of the openings at the time of this laser irradiation, by ejecting an abrasive having a predetermined structure onto the metal plate after the openings have been formed in the above-described manner.

Metal Plate

The above-described metal plate, which is the subject of processing of the method for producing the metal mask of the present invention, allows for various types of known metal plates to be employed as the metal mask. For example, a metal such as nickel, chromium, iron, copper, tin, zinc, aluminum, etc., or any alloy product thereof may be employed as the metal plate that is the subject of processing.

Specifically, any typically employed stainless steel (steel 304 or steel 316), nickel, or nickel alloy may be preferably employed as the material of the metal mask.

Moreover, the metal plate serving as the product to be treated is not particularly limited in any way, so long as it is formed of the above-described metal materials, or an alloy thereof. For example, it may also be formed by plating, etc. any of the above-described metals on to a base material of one of the above-indicated metals, or an alloy product thereof.

A plate thickness of the metal plate employed as the subject of processing may be in the range of 10 μm to 1500 μm, and more preferably in the range of 50 μm to 800 μm.

Because the plate thickness of the metal plate is approximately the plate thickness of the metal mask as produced, when the plate thickness thereof is increased or decreased, the applied thickness of the printed solder paste and ink paste is likewise increased or decreased, so that the plate thickness thereof is selected within the above-described range in accordance with the required application thickness.

Moreover, the reason that the lower limit for the thickness of the metal plate is 10 μm is that, when the thickness thereof is less than 10 μm, the ease of handling of the base material is poor because of breakage during the various treatment steps mentioned below. Furthermore, the reason the upper limit for the thickness of the metal plate is 1500 μm is that, when the thickness exceeds 1500 μm, the extraction of paste from the opening portions of the solder paste or ink paste becomes difficult, so that the metal mask cannot be effectively employed in screen printing.

Formation of Openings

The openings in the above-described metal plate are formed in accordance with the printing pattern.

The formation of these openings occurs when a laser beam is irradiated on the metal plate, causing the metal plate to be melted at the locations irradiated by this laser beam, so that the openings are formed to pass completely through the thickness of the metal plate.

Any known type of laser irradiation device may be employed as the laser device employed in the formation of these openings. For example, a device may be preferably employed that irradiates while moving a laser beam in accordance with a predesigned predetermined printing pattern, via computer numerical control (CNC) that employs CAD data, etc.

Any known type of laser may be employed for irradiating the laser beam. For example, a YAG laser, an excimer laser, a carbon dioxide gas laser, a semiconductor laser, etc. The output of the laser beam irradiated therefrom is adjusted in accordance with material and the thickness of the metal plate.

The planar shape of the openings that are formed may be formed into any type of shape that corresponds to the printing pattern when printing using a finished metal mask. For example, the openings may be formed into any shape, such as a circular shape, a square shape, an elliptic shape, a triangular shape, other polygonal shape, or a geometric shape, etc.

Ejection of the Abrasive

As described above, with regard to metal plates in which openings are formed via laser irradiation, the purpose of the present step is to remove the abovementioned dross that is deposited on the edge of the openings in the surface that is on the side opposite to the surface irradiated by the laser beam. Accordingly, treatment is performed on the surface of the metal plate on which dross is formed, whereby an abrasive is ejected under predetermined conditions, so as to slide along such a surface of the metal plate.

Abrasive

In the conventional method for producing a metal mask described with reference to Japanese Patent No. 3160084, the dross is removed by sandblasting, that is to say, by cutting away the surface of the metal plate by means of the kinetic energy generated when abrasive grains are bombarded onto the surface of the metal plate by ejecting, under high pressure, abrasive grains having an irregular shape with sharp corners and having a higher degree of hardness than that of the metal plate serving as the subject to be treated. However, in the dross removal process of the present invention, by providing a structure that allows for the ejected abrasive to slide or slip along the surface of the metal plate, the energy generated at the time the abrasive is bombarded onto the metal plate can be reduced, and the protruding dross can be selectively cut off at the time of abrasive sliding or gliding.

Thus, in order to facilitate abrasive gliding or sliding along the surface of the metal plate, the present invention employs either a "plate-shaped abrasive" or an "elastic abrasive" described below.

Abrasive 1 (Plate-Shaped Abrasive)

With regard to the first abrasive that is employable by the present process, it is possible to employ a "plate-shape abrasive", which is formed into a plate-shape having a flat surface, and having a flat shape, with a plate diameter thereof formed to be relatively large with respect to the thickness thereof.

When this type of plate-shaped abrasive is ejected at a predetermined angle onto the surface of a metal plate, it is projected so as to slide along the surface of the metal plate with a flat surface thereof assuming an orientation that is parallel to the flat surface of the metal plate that is the product to be treated.

Here, "plate diameter" of the plate-shaped abrasive indicates the maximum diameter in the shape of the flat surface of the abrasive. For example, the "plate diameter" may respectively represent the diameter, in cases where the flat surface of the abrasive is circular-shaped; the length, in cases where the flat surface of the abrasive is elliptical-shaped; the diagonal length, in cases where the flat surface of the abrasive is rectangular-shaped; and the maximum diameter measurement as determined by the flat surface shape of the respective abrasive, in cases where the shape is irregular.

The plate thickness indicates the average thickness of the abrasive. In the Examples described below, in which the plate-shaped abrasive is one with abrasive grains being carried on a carrier, the abovementioned plate thickness is "the coating thickness of abrasive grains+the thickness of the carrier".

As one method for determining the plate diameter and the plate thickness, the plate diameter and the plate thickness may be measured based on a scanning electron micrograph (SEM micrograph). For example, the measurements may be taken from the dimensions obtained from the image coordinates of digitized image data of an SEM micrograph of the abrasive of the present invention.

Moreover, the average value may also be measured via the dimensions obtained from a predetermined number of samples (for example, 100 samples) selected at random, with the resulting average value thereof being defined as the plate diameter or the plate thickness.

The average plate diameter of the abrasive of the present invention is in the range of 0.05 mm to 10 mm, and more preferably in the range of 0.1 mm to 8 mm.

The flatness of the abrasive can be determined by the ratio of the plate diameter to the thickness of the abrasive, which in the present embodiment is referred to as "plate ratio", given by "plate diameter/thickness".

The desired plate ratio in the abrasive of the present invention is from 1.5 to 100, and preferably from 2 to 90.

When an abrasive with a plate diameter smaller than 0.05 mm is employed, it becomes difficult to assume an orientation whereby the abrasive slides parallel to the surface of the metal plate. Moreover, when the diameter of the abrasive employed is more than 10 mm, the ejection of such an abrasive becomes difficult. For example, in cases where this type of abrasive is ejected via a nozzle along with a compressed gas, the diameter of the nozzle employed in the ejection thereof is increased in response to the increased plate diameter of the abrasive, so that the nozzle portion and the tube diameter of the ejection hose required for the nozzle portion are also increased. In cases where the nozzle is manually operated, this adversely affects the operability thereof. Accordingly, the plate diameter of the abrasive is preferably equal to or less than 10 mm, as described above.

The plate ratio is expressed as: plate ratio=plate diameter/plate thickness (Here, the thickness of the carrier+the coating thickness of the abrasive grains).

Therefore, when the plate diameter is 10 mm and the plate thickness is 0.1 mm, plate ratio=plate diameter/plate thickness=10/0.1=100.

Here, the grain diameter of the employed abrasive grains is 1 mm to 0.1 μm, for example.

Moreover, the reason for having the plate ratio in a range of 1.5 to 100 is that, when the plate ratio is greater than 1.5, and when the abrasive is ejected to bombard the surface of the product to be treated, it is possible to achieve a sliding orientation in which this flat surface of the abrasive makes slidable contact with the surface of the product to be treated with a high degree of probability, so that the removal of heavy dross can be performed by causing the abrasive to slide along the surface of the product to be treated in this orientation. On the other hand, when the plate ratio is less than 1.5, the amount of the abrasive assuming an orientation in which the flat surface thereof slides on the surface of the product to be treated via the collision with the product to be treated is decreased, so that the surface of the metal plate is cut by the energy generated by the bombardment of the abrasive grains, which, as with cutting by a known sandblasting technique, causes the surrounding edges of the openings to be cut, rather than just cutting the dross.

When the plate ratio exceeds 100, the end of the abrasive ejected from the nozzle frequently curves, buckles, or breaks due to air resistance, or when bombarded on the surface of the workpiece.

The abovementioned plate-shaped abrasive may have flexibility or deformability. This type of flexibility or deformability may be achieved by employing an abrasive having the flexible or deformable carrier described below, or achieved by producing an abrasive formed with the abovementioned plate shape and aggregating abrasive grains having flexibility or deformability with a binder, etc.

By providing an abrasive with this type of flexibility or deformability, the indentations, etc. that are formed on the surface of the product to be treated at the time the abrasive is bombarded thereonto can be prevented.

The shape of the abrasive of the present invention is not specifically limited in any way, so long as it is formed into the flat plate shape described above. For example, the shape may be selected from a circular shape or semi-circular shape, an elliptical shape, a triangular shape, a rectangular shape, other polygonal shapes, an irregular shape, etc., or any shape employing a combination of shapes selected therefrom.

Moreover, any of the configurations described below may be employed as the configuration of the abrasive employed by the present invention.

Furthermore, in plate-shaped abrasive grains formed into a plate shape, in which the abrasive grains themselves have flat surfaces (hereinafter, a plate-shaped abrasive with this configuration will be referred to as "integrated abrasive grain type" or an "integrated type"), a metal, such as aluminum, copper, iron, tin, zinc, etc., or an alloy thereof, or fiber, resin, ceramic, or any composite thereof may be employed to form the plate shape having a flat surface.

An abrasive in which the abrasive grains are carried on one or both surfaces of the plate-shaped carrier having the flat surface (hereinafter, a plate-shaped abrasive with this type of configuration will be referred to as the "carried abrasive grain type" or "carried type").

An abrasive in which the abrasive grains are dispersed in the material forming the carrier, and the carrier with the abrasive grains dispersed therein are formed into a flat shape with a flat surface (hereinafter, a plate-shaped abrasive with this type of configuration will be referred to as "dispersed abrasive grain type" or "dispersed type").

The "carried type" among the above-indicated types of abrasives may be consisted of different materials such as the grain type, grain diameter, distribution, etc. carried on one surface of the carrier from those of the abrasive grains carried on the other surface.

Moreover, in this "carried type" abrasive, in addition to the abrasive grains carried on only one side of the carrier, a material that exerts a function which is different from that of these abrasive grains may be carried on the other surface, for example, a coloring agent, an anti-rust agent, a lubricant, a spherically-shaped bead with a varnishing function, etc., making it possible to provide the abrasive with the function possessed by such a carried material.

Carrier (for Plate-Shaped Abrasive)

In the configurations of the abrasive of the present invention configured as described above, the carrier for carrying the abrasive grains is included in the "carried type" and "dispersed type" abrasives, but is omitted from the "integrated type" abrasive.

Hereinafter, examples of such types of carriers will be described in greater detail.

Carrier for Carried Abrasive Grain Type Abrasive

In a "carried type" abrasive, in which the abrasive is constructed to have the abrasive grains carried on one or both surfaces of a plate-shaped carrier, so long as a sheet-shape or film shape thereof is formed to have a thickness of approximately 0.001 mm to 5 mm, any types of materials can be employed without restricting materials thereof or the like.

For example, a sheet or film of paper, cloth, non-woven fabric, rubber, plastic, a fiber material, a resin, or other type of organic material; a foil or plate composed of a metal such as, aluminum, tin, copper, zinc, iron, etc., or any alloy thereof; or a sheet of inorganic material, such as glass, alumina, ceramics, etc., may be employed in this type of carrier.

Carrier for Dispersed Abrasive Grain Type Abrasive

When forming the abrasive of the present invention by forming a plate shape from the material forming the carrier on which the abrasive grains are carried, various types of materials may be employed as the carrier of the "dispersed type" abrasive, so long as the material is capable of having the abrasive grains dispersed therein and is capable of being formed into the plate shape while the abrasive grains are dispersed therein, for example, rubber, or plastic, etc., may be appropriately employed.

Moreover, as the material forming the carrier in which the abrasive grain is dispersed, the abrasive of the present invention may employ a known material used a grindstone bonding agent, such as a vitrified bonding agent, a silicate bonding agent, a resinoid bonding agent, a rubber bonding agent, a vinyl bonding agent, a shellac bonding agent, a metal bonding agent, an oxychloride bonding agent, etc., with the abrasive grains dispersed therein and formed into a plate shape. Moreover, in such cases, the abrasive need not necessarily be provided with flexibility or deformability.

Abrasive Grains

As said abrasive grains, as well as being brought into contact with the product to be treated so that the product to be treated may be processed into a predetermined state, etc., so long as the abrasive grains employed in the "carried type" abrasive are grains that can be carried on the carrier through an adhesive, etc., and so long as the abrasive grains employed in the "dispersed type" abrasive are grains that can be dispersed in the material forming the carrier, a variety of abrasive grains may be employed, without the material, shape, or dimensions thereof, etc., being limited in any way.

Various materials generally used as abrasives may be employed; for example, alumina such as, white alundum (WA) or alundum (A), etc.; green carborundum, diamond, etc.; c-BN, boride, carbon boride, titanium boride, cemented carbide allay, etc.; as indicated in Table 1 below.

Moreover, any mixture of two or more of these abrasive grains may also be employed.

TABLE 1

Examples of the Abrasive Grains Employed as the Abrasive of the Present Invention

| | |
|---|---|
| Plant-based | Corn core; seed hull of walnut, peach, nuts, apricot, etc.; pulp; cork |
| Metals | Iron, steel, cast iron, cobalt, nickel, gallium, zirconium, niobium, molybdenum, rhodium, palladium, silver, indium, tin, antimony, zinc, stainless steel, titanium, vanadium, chromium, aluminum, silicon, $MnO_2$, $Cr_2O_3$, or alloys thereof |
| Ceramics | Glass, quartz, alundum, white alundum, carborundum, green carborundum, zircon, zirconia, garnet, emery, carbon boride, titanium boride, aluminum-magnesium, boride, or boride nitride |
| Inorganic materials | Calcium carbonate, calcium sulfate, or calcium fluoride, barium sulfate, barium chloride, aluminum sulfate, aluminum hydroxide, strontium carbonate, strontium sulfate, strontium chloride, titanium oxide, basic magnesium carbonate, magnesium hydroxide, carbon, graphite, graphite fluoride, molybdenum disulfide, or tungsten disulfide |

The particle size of said abrasive grains is also not limited in any particular way, and therefore, may vary depending on a surface condition of the metal mask after processing, etc.; for example, the abrasive grain with an average grain diameter in the range of 1 mm to 0.1 μm may be employed. Moreover, in cases where a mirror finish is applied by glossing the processing surface of the workpiece, the employment of fine abrasive grains with an average grain diameter of no more than 6 μm (#2000 or greater) is preferable. In the abrasive of the present invention, fine abrasive grains with an average grain diameter of no more than 1 μm (#8000 or greater) may be employed.

Moreover, in cases where the processing surface of a workpiece is to be cut and processed into a predetermined shape, rough abrasive grains with an average grain diameter of no less than 30 μm (#400 or less) may be employed, or in the present invention, abrasive grains with an average grain diameter of 1 mm may also be employed.

Both of the plate-shaped abrasives of a "carried abrasive grain type" and a "dispersed abrasive grain type" may have abrasive grains with up to approximately half the grain diameter thereof exposed. Although the abrasive grains may have up to approximately half the grain diameter thereof exposed, in such cases, the degree of exposure from the carrier of the abrasive grains is preferably 10% to 50% of the grain diameter thereof. With abrasive grains in which the degree of exposure is less than 10%, the length of the abrasive grain involved in processing is reduced, so that the abrasive force thereof is reduced, and the working efficiency thereof is poor. With abrasive grains in which the degree of exposure is more than 50%, the surface area of the abrasive grains carried on (embedded in) the carrier is reduced, which causes the retaining strength of the abrasive grains in the carrier to be reduced, so that the abrasive grains fall off the carrier during processing, thereby preventing processing uniformity from being maintained. Moreover, the durability of the abrasive is poor, and the cost is high. Accordingly, the degree of exposure is preferably from 20% to 40%.

When the "carried type" abrasive is manufactured, the fixation or carry of the abrasive grains to or in the carrier may be performed through an adhesive, which in such cases may be any conventionally employed adhesive used for the fixation or carry of abrasive grains on abrasive paper or abrasive cloth, for example.

For example, an epoxy resin adhesive, a polyurethane resin adhesive, an acrylic adhesive, a silicon adhesive, a rubber adhesive, a cyanoacrylate adhesive, a hot melt adhesive, or an ultraviolet light curing adhesive may be employed as this adhesive.

Manufacturing Method of the Abrasive

Hereinafter, examples of the manufacturing methods for each type of adhesive will be described in greater detail.

"Integrated Abrasive Grain Type" Plate-Shaped Abrasive

A metal, such as aluminum, copper, iron, tin, zinc, etc. and alloys thereof, formed into a plate or foil shape by rolling or the like; a resin formed into a plate shape or film shape; a ceramic plate; or a fabric, non-woven fabric, etc. is cut so as to have a predetermined plate diameter to form the abrasive of the present invention.

Moreover, a fabric-type abrasive is adhesively affixed to the abovementioned adhesive with a predetermined thickness, so that the shape of the fiber is retained, without fraying during the manufacturing processing. Afterwards, it is cut to the required shape and dimensions.

"Carried Abrasive Grain Type" Plate-Shaped Abrasive

Manufacturing Method 1

A conventional coating device, such as a knife coater, etc., is employed to apply a coating of a composition having a weight ratio of compounded abrasive grains to adhesive agent of 1:0.2 to 1:2.0, and a post-application dried thickness of 2 μm to 2000 μm, to one or both surfaces of a 1 μm to 5000 μm thick foil, sheet, or film, etc. serving as the carrier, which is subsequently dried and cut to a predetermined plate diameter to form the plate-shaped abrasive of the present invention.

Manufacturing Method 2

An adhesive is applied so as to provide a 5 μm to 4000 μm thick coating on one or both sides of the carrier, and abrasive grains are adhered to the adhesive layer before the curing of the adhesive to carry the abrasive grains on the surface of the carrier.

In this manner, the carrier on which the abrasive grains are carried is cut to a predetermined plate diameter to provide the abrasive of the present invention.

Manufacturing Method 3

In cases where a comparatively soft metal, such as aluminum, etc., or an elastic body, such as rubber, resin, etc., is employed as the carrier, the desired amount of the abrasive grains is dispersed on the carrier formed into the plate shape from the above materials, with the abrasive grains being embedded into the surface of the carrier by pressing the top of the abrasive grains dispersed thereon.

In this manner, the carrier on which the abrasive grains are carried is cut into a predetermined plate diameter, to provide the abrasive of the present invention.

"Dispersed Abrasive Grain Type" Plate-Shaped Abrasive

The materials forming the abrasive grains and the carrier, for example, the resin material composing the carrier, is compounded at a ratio of 10 wt % to 40 wt %, with respect to 60 wt % to 90 wt % of the abrasive grains, and is then formed into a plate shape and cut to the predetermined plate diameter, to form the abrasive of the present invention.

For example, a method for manufacturing "dispersed type" (plate-shaped elastic abrasive) in which the carrier is composed of rubber will be described. After an initial masticating process is conducted, the raw rubber material is kneaded. In the kneading step, the abrasive grains as well as the compounding agent may also be added.

Next, the raw material whose plasticity has been adjusted by the kneading of the compounding agent or the abrasive grains is processed into a sheet-like shape or flat plate-like shape using an extruder, etc., equipped with a screw, or using a calender formed by arranging a plurality of rollers, with the molding process therefor being subsequently continued until the material is in a moldable state.

The raw material that is processed into a plate shape is kept in a plate shape during the molding process, and is cut to a predetermined size and shape to obtain fragments with a predetermined plate diameter. Afterwards, the fragments obtained by the molding process are heat treated by a vulcanizing process to initiate a cross-linking reaction caused by a vulcanizing agent contained within the fragments, and a portion except for the abrasive grains is then processed into the elastic body. Moreover, various types of conventional devices can also be employed in the vulcanizing process, for example, an extrusion-type, a vulcanizing can-type, or a press-type continuous vulcanizer, etc.

Moreover, the molding (molding process) into the fragments and the subsequent cross-linking via vulcanization (vulcanizing process) may also be performed in the reverse order. For example, the raw material that is processed into a plate shape from the extrusion process or rolling process may also be transferred, as is, to a vulcanizing process, where it is processed into an elastic body, and afterwards cut during a molding process.

Moreover, in cases where a thermoplastic elastomer is employed as the abovementioned polymer raw material, the manufacturing may be by a conventional thermoplastic elastomer manufacturing process, whereby, first a kneading process is conducted once the compounding agent and the abrasive agent have been added to a mixed polymer raw material, then the milled raw materials are heated to a temperature greater than or equal to the melting points thereof, next a molding process is conducted so that the molten raw materials are formed into a plate shape by extrusion or injection, etc., and finally, the plate-shaped body formed thereby is cut into a predetermined plate diameter by a cutting process, to thereby produce the abrasive. Examples of equipment that can be used in the kneading process described above are rollers, pressure kneaders, internal mixers, etc.

Abrasive 2 (Elastic Abrasive)

As another type of abrasive that is employable by the present invention, an abrasive with elastic deformability (elastic abrasive) may be employed.

This type of elastic abrasive is bombarded onto the surface of the metal plate, by being ejected onto the surface of the metal plate at a predetermined angle of inclination. By doing so, the kinetic energy generated at the time of this bombardment is absorbed by the elastic deformation of the abrasive, so that the bombarded abrasive is able to slide along the surface of the metal plate.

Either a carried abrasive grain type elastic abrasive having elastic deformable, in which the abrasive grains are carried on the surface of the carrier that is the elastic body, or a dispersed abrasive grain type elastic abrasive, in which the abrasive grains are kneaded, etc. into a rubber, etc. elastic body, so that the abrasive grains are dispersed within the elastic body, may be employed as this type of abrasive.

Carried Abrasive Grain Type Elastic Abrasive

Among the abovementioned elastic abrasives, the carried abrasive grain type is one with abrasive grains carried on the surface of the carrier that is an elastic body, and in addition to rubber or a synthetic resin material, a carrier that is formed of gelatin, or a plant fiber, etc. may be employed as this type of carrier.

Moreover, because abrasive grains similar to those described with regard to the above-described plate-shaped abrasive can be employed as the abrasive grains supported on the carrier, a description thereof will be omitted.

Dispersed Abrasive Grain Type Elastic Abrasive

The dispersed type constituting the other type of elastic member described above is an abrasive in which abrasive grains are kneaded into, etc. and dispersed within the carrier that is an elastic body, which is provided with elastic deformability throughout its entirety, as a result of the elasticity of the carrier.

Elastic Carrier

Various carriers may be employed as the carrier in which the abrasive grains are dispersed, so long as the carrier has elastic deformability, and the abrasive grains can be dispersed therewithin. In the present embodiment, the carrier is constructed by mixing various sorts of mixing agents into a raw material polymer.

Moreover, the elastic carrier employed in this case is constructed so as to allow the above-described plate-shaped abrasive to be elastically deformed. Similarly, it can also be used as the carrier material in the abrasive formed of abrasive grains dispersed in the carrier.

Raw Material Polymer

The raw material polymer as a main raw material, which becomes an elastic body such as a rubber or a thermoplastic elastomer by adding various sorts of additives described hereinafter, can be used not only as solid but also as latex such as a liquid rubber or an emulsion. Moreover, from a viewpoint of reducing an impact resilience modulus of the base material and the abrasive including the base material, the raw material polymer is preferably of lower impact resilience due to its characteristics.

As the rubber, not only a natural rubber but also various sorts of synthetic rubbers can be used. For instance, an isoprene rubber, a styrenebutadiene rubber, a butadiene rubber, an acrylonitrilebutadiene rubber, a chloroprene rubber, an ethylenepropylene rubber, a chlorosulfonated polyethylene, a chlorinated polyethylene, a urethane rubber, a silicon rubber, an epichlorohydrin rubber, a butyl rubber or the like can be listed.

Further, as the thermoplastic elastomer, a styrene block copolymer, a chlorinated polyethylene elastomer, a polyester elastomer, a nitrile elastomer, a fluorinated elastomer, a silicon elastomer, an olefin elastomer, a vinyl chloride elastomer, a urethane elastomer, a polyamide elastomer, an ester halogen polymer alloy or the like are listed.

The rubbers and the thermoplastic elastomers described above as raw material polymers may be used alone, or multiple sorts of them may be mixed (or used simultaneously) for use.

Furthermore, the rubber or the thermoplastic elastomer obtained by recycling collected waste products or wastes discharged in a manufacturing process may be used.

Compounding Agent

The raw material polymer is mixed with various sorts of compounding agents, and thereafter, is processed as an elastic body composing the base material.

The case of using the rubber as the raw material polymer will be described hereinafter As the compounding agent with which the rubber polymer is mixed, there are listed various sorts of compounding agents generally used for rubber molding such as a vulcanizing agent for cross-linking between rubber molecules and a vulcanization accelerator for accelerating a cross-linking reaction by the vulcanizing agent, and in addition hereto, a plasticizer which gives plasticity to the rubber, thereby to help compounding agents to be mixed and dispersed and to improve a workability in rolling, extrusion or the like, a tackifier to impart adhesion required in manufacturing the rubber for improving a workability, a filler which not only lowers a product cost by increasing in weight but also improves physical properties (mechanical properties such as tensile strength or elasticity) or a workability of the rubber, a stabilizer, a dispersant or the like.

As the filler, in order to impart weight to the abrasive, for instance, a metal of which hardness is lower than that of the abrasive grains, ceramics, an inorganic resin or the like may be used, and they may be compounded adjustably so that an abrasive density adapted to the blast processing is obtained. Also, in order to prevent static electricity from occurring, a material having conductivity such as a carbon black or a metal grain may be used.

In the above embodiment, the raw material polymer is a rubber polymer, but as mentioned above, the thermoplastic elastomer may be used as the raw material polymer. In the case, various sorts of compounding agents generally used in molding the thermoplastic elastomer may be used.

Abrasive Grain

As the abrasive grains dispersed within the elastic carrier, abrasive grains similar to those employed in the above-described plate-shaped abrasive may be employed.

Compounding Ratio

The compounding ratio (content rate) of the abrasive grains in the abrasive is preferably within a range of 10 to 90 wt % when the abrasive content is 100 wt %.

If the content rate of the abrasive grains in the abrasive is equal to or less than 10 wt % when the abrasive amount is 100 wt %, the impact resilience modulus of the abrasive becomes larger due to an influence of the base material thereof as an elastic body, and the problem exists that after the abrasive which is injected onto the surface to be processed of the workpiece collides with the surface, it recoils without sliding on the surface or that the distance by which the abrasive slides on the surface becomes shorter. And moreover, the problem also arises that a density of the abrasive grains existing on the surface of the abrasive becomes so small that a grinding force is deteriorated and a processing ability is deteriorated.

On the other hand, when the content of the abrasive grains exceeds 90 wt %, because the abrasive grains become prevalent, and the binding strength of the base material to the abrasive grains is weakened, the elastic deformability thereof is lost.

The compounding ratio of the abrasive grains in the abrasive can be preferably set to 60 wt % to 90 wt % with respect to the abrasive of 100 wt %, which makes it possible to more suitably prevent the abrasive from being bombarded while maintaining the impact resilience modulus and grinding force.

Particularly, when the content rate of the abrasive grains in the abrasive exceeds 70 wt %, even if the base material has a material quality that may cause a dust explosion, using the material, which does not cause a dust explosion, for the abrasive grain enables the dust explosion to be prevented even when the abrasive is atomized.

Furthermore, in the abrasive of the present invention, the abrasive grains are not only attached to the base material surface but also dispersed into the base material. Even when the abrasive grains existing on the base material surface of the abrasive are pulled out, separated, crushed, worn or the like due to various sorts of impacts or frictions generated in the blast processing steps such as injection onto the workpiece, polishing or cutting of the surface of the workpiece or collecting or diversion of the abrasive, new abrasive grains in the base material are exposed to the surface because the base material is also worn or crushed by the impacts or frictions in the blast processing step. Thus, a grinding ability of the abrasive can be maintained.

Therefore, the abrasive of the present invention, which is excellent in durability and does not require an abrasive regenerating step, can be used for a long period of time and a plurality of times, and can be suitably used for an abrasive recycling process line. Exposure of the new abrasive grains as described above can be suitably achieved by appropriately changing the material quality of the base material, the compounding ratio (content) of the abrasive grains in the abrasive, a productive process or the like to adjust a wear or crush rate of the base material, brittleness of the abrasive or the like.

Method for Manufacturing

The abrasive of the present invention, when the above-described rubber (raw material rubber) is used as a raw material polymer, can be manufactured through known rubber manufacturing steps.

In such cases, with regard to the production of the above-described plate-shaped abrasive, a process of forming all the kneading material at once into a plate shape is included in this production process. However, the formation of the plate shape is not is required for the abrasive of the present invention, and therefore can be omitted.

Abrasive Ejection Method

The ejection of the above-described plate-shaped abrasive or elastic abrasive may be performed by any of various known methods. For example, the abrasive may be ejected by a nozzle type method, whereby the abrasive is ejected along with a compressed gas, such as compressed air, etc.; an impeller method, whereby the abrasive is ejected by stamping via a rotating impeller; or a centrifugal method, whereby the abrasive carried on rotor blades is ejected via the centrifugal force generated therefrom.

In the present embodiment, the nozzle method is employed to allow the processing and the ejection of the abrasive to occur at a predetermined location, even when the workpiece is a large heavy object.

Ejecting Conditions of Abrasive

The ejection of the abrasive is performed with an incident angle of $\theta$ being $0<\theta\leqq80$ degrees with respect to the processing surface of the metal plate serving as the metal mask. Preferably, an incident angle $\theta$ ranges from 5 degrees to 70 degrees.

When the ejection of the abrasive is performed along with a compressed liquid, such as compressed air, etc., as in the above-described nozzle type method, etc., the ejection of the abrasive for blast processing is performed at an ejection speed of 5 m/sec to 150 m/sec, or at an ejection pressure of 0.01 MPa to 0.7 MPa.

Other methods are performed at an ejection speed of 5 m/sec to 80 m/sec.

Action or the Like

As described above, the metal plate to be formed into the metal mask, for example, is fixed at a predetermined position on the workbench, with a computer controlled laser beam being irradiated while moving to predetermined positions on the surface of this metal plate, so that the shapes of the openings are formed in accordance with the path of movement of this laser beam.

At this time, dross (burrs) originating from melting and deposition of metal in the regions where the openings are to be formed during formation of the openings by laser irradiation is produced on the surface at the opposite side from the laser irradiated surface of the metal plate in which openings are formed, and either of the above-described abrasives is ejected onto this surface where dross is produced, under the conditions described above.

In cases where either of the above-described abrasives is ejected under the abovementioned conditions and the ejected abrasive is a plate-shaped abrasive, this plate-shaped abrasive has a property that allows it to be projected with a flat surface thereof in a parallel orientation with respect to the scattered direction. Moreover, in cases where the abrasive has elastic deformability, the impact from the bombardment of the abrasive onto the metal plate that is the subject to be treated is absorbed via this elasticity.

Accordingly, as shown in FIG. 1, these abrasives are ejected so as to be inclined at predetermined incident angle $\theta$ with respect to the surface of the metal plate. As a result, although some of the kinetic energy V of the abrasive at the time of ejection acts on the metal, the component ($V \times \cos \theta$) parallel to the surface of the metal plate is included. In addition, in cases where the abrasive is elastic, the component ($V \times \sin \theta$) perpendicular to the surface of the metal plate is absorbed by the elastic deformation of the abrasive. Accordingly, the ejected abrasive slides along the surface of the metal plate, as a result of the synergistic effect of ejecting the abrasive at an inclined angle of incidence with respect to the surface of the metal plate, and the above-described plate shape and/or elastic body of the ejected abrasive.

Accordingly, the surface of the metal plate is processed with a kinetic energy according to the ejection angle. As a result, the dross deposited portions protruding from the surface of the metal plate are mainly cut.

Moreover, because the perpendicular component ($V \times \sin \theta$) acting on the above-described metal plate is alleviated, hardly any bending occurs in the metal plate.

In the method for producing the metal mask disclosed in '084, the removal of dross is performed by a conventional sandblasting method. Since the size of these conventional abrasive grains is from a few micrometers to a few hundred micrometers, and the surface to be treated is processed by having each particle ejected from a nozzle, the abrasive frequently tends to penetrate into metals having hardness lower than that of the abrasive grains themselves.

On the other hand, in the present invention, even when abrasive grains with a similar diameter are employed, because these abrasive grains are carried on the carrier or dispersed within the carrier, the surface of the metal plate is almost never penetrated.

Moreover, in the abrasive with abrasive grains dispersed within the carrier, or the abrasive grains carried on the surface of the carrier, even if abrasive grains with a diameter similar to that of the abrasive grains employed in the conventional sandblasting described in Related Art are used as the abrasive grains constituting the portion of such a structure that applies the cutting force, because these abrasive grains are dispersed within the carrier or carried on the surface of the carrier, the abrasive does not penetrate into the metal plate when it is bombarded thereon.

Accordingly, in the method for producing a metal mask for screen printing of the present invention, the abrasive slides or slips along the surface of the metal plate during the dross removal process. As a result, the amorphous and sharply shaped irregularities are not formed in the surface of the metal plate on which the abrasive has slid or slipped, and therefore, they cannot become clogged with solder paste or ink paste. Accordingly, reductions in the printing quality via the incorporation, etc. of clogged solder paste or ink paste in which a degradation, a change in properties, or hardening thereof, etc., has occurred, into the newly supplied solder paste or ink paste can be prevented.

Moreover, by employing an abrasive in which the granularity of the abrasive grains has been adjusted, the surface roughness of the solder paste or ink paste, etc. employed in printing can be suitably regulated with respect to the paste-like properties thereof.

According to the method of the present invention, even in cases where the irregularities formed in the surface of the metal plate are due to the regulation of the diameter of the abrasive grains carried on the carrier, for example, because these irregularities are the accumulation of strip-shaped cuts formed by the abrasions of the abrasive sliding along the surface of the metal plate, and not irregularities formed by bombarding the surface of the metal plate with the abrasive, there is no deformation, such as bending, etc. in the metal plate.

Example

Hereinafter, the results of a comparison between the metal mask produced by the method of the present invention (Example), and a metal mask in which dross removal was conducted via a known sandblasting method (Comparative Example) will be explained.

Production Conditions of the Example

Metal Plate

An SUS304 steel plate (230 mm length×230 mm width×50 µm thick) that was preadjusted to have a surface roughness (Ra) of 0.062 µm was employed as the metal plate that was the subject of treatment.

Formation of Openings

The metal plate was set on the surface of a laser irradiation table provided in a laser processing machine ("ML-7112A", manufactured by Miyachi Corportion) with a jig, and a 100× 100 pattern of 45 µm circular diameter patterns was etched via laser irradiation.

Figure 2:
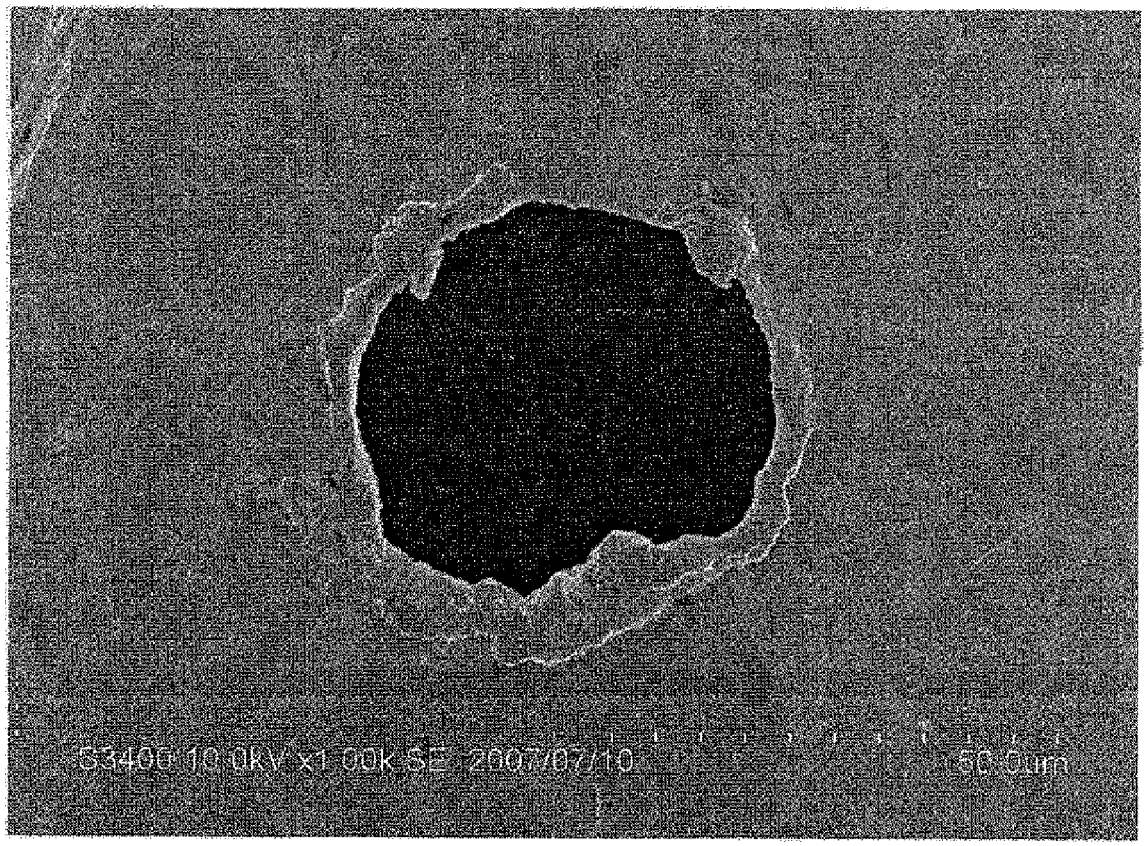
FIG. 2 is a scanning electron micrograph (SEM) of a metal mask in a dross deposited state.

FIG. 2 shows an SEM micrograph of the dross deposited via the laser processing at such a time.

Dross Removal

With respect to the surface of the metal plate on which dross is formed after the openings are formed via the above-described laser irradiation, the abrasive shown in Tables 2 and 3 below was ejected under the conditions indicated in Table 4.

TABLE 2

Abrasive Employed by the Example (Elastic Abrasive)

| | |
|---|---|
| Type | Elastic abrasive |
| Shape and Size | Grains with a 0.6 mm grain diameter |
| Carrier | Rubber |
| Abrasive Grains | Green carborundum (GC) #3000 (average abrasive grain diameter of 4 µm), manufactured by Fuji Manufacturing Co., Ltd. |
| Production Method, etc. | A compounded material was obtained by adding and kneading a compounding agent and abrasive grains to masticated rubber, with the adhesive grains being compounded at a weight ratio of 70% with respect to the total content of 100% of the mixture. The kneaded material was pulverized to form grains with a grain diameter of approximately 0.6 mm. The resulting grains were then vulcanized to produce the elastic abrasive employed in the Example. |

TABLE 3

Abrasive employed in the Example

| | |
|---|---|
| Shape and size | 1.5 mm × 1.5 mm square-shaped flat surface, with a thickness of 0.25 mm |
| Size etc. | |
| Plate diameter | 2.8 mm (average diameter of 100 randomly selected samples, as determined by SEM micrographs) |
| Plate Ratio | 11.2 (2.8 mm plate diameter/0.25 mm) |
| Carrier | Craft paper (50 µm thick; water-proof treated) |
| Abrasive Grains | Green carborundum (GC) #2000 (average abrasive grain diameter of 6.7 µm), manufactured by Fuji Manufacturing Co., Ltd. |

TABLE 3-continued

Abrasive employed in the Example

| | |
|---|---|
| Production Method | A compounded liquid that was obtained by compounding adhesive grains at a weight ratio of 1:1.5 (abrasive grains:adhesive agent) into an epoxy resin adhesive agent was applied with a knife coater to one side of a paper carrier, so that a dried thickness thereof was 0.2 mm. After drying, the carrier was cut into a 1.5 mm × 1.5 mm square shape. |

TABLE 4

Ejecting conditions of the Elastic Abrasive of the Example

| | |
|---|---|
| Ejection Device | Air blasting device ("LDQSR-3"; manufactured by Fuji Manufacturing Co., Ltd.) |
| Ejection Pressure | 0.06 MPa |
| Ejection Distance | 50 mm |
| Ejection Angle | 45 degrees with respect to axis of the workpiece |
| Processing time | 3 minutes |

Production Conditions of the Comparative Example

A method for producing a metal mask of the Comparative Examples omits the process whereby dross is removed under the conditions described below, and with regard to additional conditions, the mask is produced under similar conditions to those of the metal mask described in the Example.

TABLE 5

Blast Processing Conditions of the Comparative Example

| | |
|---|---|
| Ejection Device | Air blasting device (gravity-type "SG-3"; manufactured by Fuji Manufacturing Co., Ltd.) |
| Ejection Gun | F2-3 |
| Abrasive | Fuji Rundum (GC) #600 (average abrasive grain diameter of 40 µm) |
| Ejection Pressure | 0.3 MPa |
| Ejection Distance | 150 mm |
| Ejection Angle | 70 degrees |
| Processing time | 30 seconds |

Inspection Items

In relation to the metal masks produced by both of the abovementioned methods, the following items were inspected via each of the methods described below.

(A) Confirmation of Occurrence of Bending or Deformation

The presence or absence of bending or deformation was confirmed visually.

(B) Confirmation of the Dross Removal State

The flatness of the surface to be treated and the dross removal state was confirmed by observing a surface under a scanning electron microscope (SEM: "S-3400N", manufactured by Hitachi, Ltd.). Moreover, the SEM observation was conducted on 30 mm×30 mm test sample that was cut from the metal mask.

(C) Confirmation of Abrasive Penetration

The presence or absence of abrasive penetration into the metal plate was confirmed by the identification of such elements via EDX and SEM observations. Moreover, 30 mm×30 mm test samples were cut out of the metal masks for SEM and EDX observations.

(D) Confirmation of Surface Roughness

The surface roughness of the metal masks produced by the methods of the Example and Comparative Example, respectively, were measured using a contact stylus type surface roughness tester ("SURFCOM 130A", manufactured by Tokyo Seimitsu Co., Ltd.).

(E) Confirmation of Accurate Printing

A tensile pulling force was applied to a mesh-like silkscreen material, so that the silkscreen material was tightly stretched across the edges of a 320 mm×320 mm aluminum frame using an epoxy resin then provided thereon. A 10 mm (approx.) periphery portion of a post-dross removal metal mask with epoxy resin applied thereto was pasted to the center of the silkscreen material. The silkscreen material provided portions other than the post epoxy resin cured 10 mm (approx.) periphery portion of the metal substrate were removed and used for screen printing.

A polyurethane squeegee was used to print by placing the ink paste on the metal mask while moving at speed of 5 mm/sec to 10 mm/sec, and the printing condition was confirmed.

Inspection Results (A) Presence or Absence of Bending

Example

Even after the abrasive was ejected, the flat shape was retained without any deformation due to bending in the metal plate, and therefore, the subsequent process of providing the silkscreen over the frame was performed without any problems.

Comparative Example

When the workpiece was retrieved from the jig, bending had occurred in the metal plate, which thereby caused problems during the subsequent process of providing the silkscreen material over the frame.

Moreover, with regard to the metal mask of the Comparative Example in which bending had occurred, although sandblasting was further performed on the surface at the side opposite to that of the surface in which sandblasting was already conducted, in order to eliminate such bending, this additional treatment was unable to completely eliminate the bending in the metal mask.

Moreover, the flatness of the metal plate could not be ensured, and as a result, wavy-shaped deformations were confirmed.

(B) Dross Removal Conditions

Example

Figure 3:
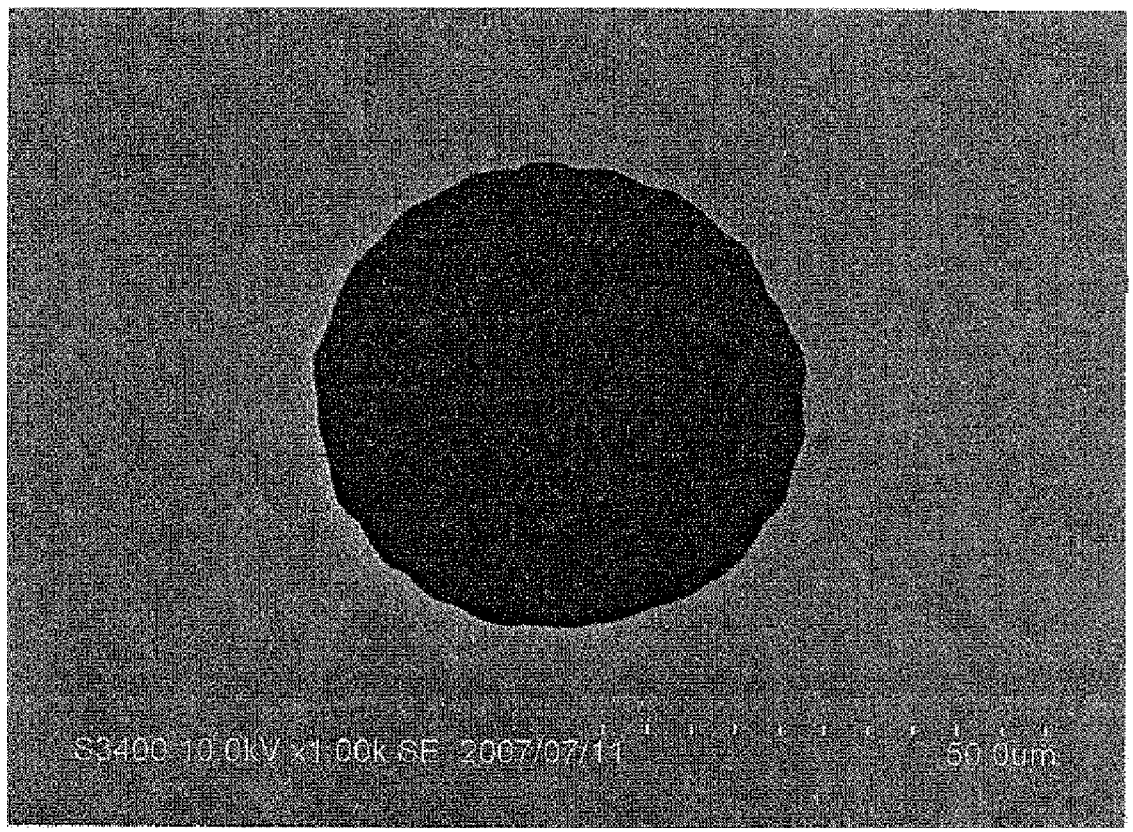
FIG. 3 is a scanning electron micrograph (SEM) of a metal mask produced by a method of the present invention.

FIG. 3 shows an SEM micrograph of the metal plate of the Example after the abrasive was ejected.

As is clear from FIG. 3, it was confirmed that the dross deposited on the metal mask of the Example was completely removed. Moreover, the walls of the openings were also smoothly polished.

Example

Although the dross deposited on the metal mask was completely removed, it was confirmed that the edges of the openings (edge portions) were also cut, and that the shapes of the openings were thereby deformed.

(C) Abrasive Penetration

Example

Neither the SEM micrographs nor the EDX observations were able to confirm the penetration of the abrasive into the metal plate.

Comparative Example

The penetration of the abrasive grains was confirmed.

(D) Surface Roughness

Example

In the metal mask produced by the method of the present invention (Example), the surface roughness (Ra) thereof was 0.058 µm, which thereby confirmed that the surface roughness (Ra: 0.062 µm) before treatments, such as the ejection of the abrasive, the formation of openings, etc., via the method of the present invention, was improved by being slightly smoothened.

Comparative Example

On the other hand, the fact that the surface roughness of the metal mask of the Comparative Example was (Ra) 0.156 µm, which was approximately 2.5 times as the surface roughness of the unprocessed metal plate (Ra: 0.062 µm), confirmed that the post-processed surface was roughened when compared to the pre-processed surface.

(E) Accurate Printing

Example

In the printing employing the metal mask produced by the method of the present invention (Example), the rolling of the ink paste was achieved, and the painting ink was pushed out of the openings of the mask, so that the image printed on the substrate was identical to the shapes of the openings, etc.

It was confirmed that in order to roll the solder paste or ink paste, along with the paste properties, such as the surface tension, or viscosity, etc., a printing squeegee drift speed and metal mask surface roughness corresponding thereto also are required, that significant surface roughness, such as that formed by sandblasting, is not really necessary, and that favorable rolling could be accomplished even with the comparatively smooth surface roughness (Ra) of 0.058 µm, as provided in the metal mask of the Example.

Moreover, in the metal mask produced by the method of the present invention, because the above-described plate-shaped abrasive or elastic abrasive slides along the surface of the metal plate to make striped-shaped unidirectional cuts in the surface of the metal plate via the abrasive grains that are dispersed in or carried on these abrasives, so that the surface of the metal plate has a desirable surface roughness via the accumulation of the indentations made by these stripe-shaped cuts, a metal with a surface roughness that is comparatively rougher than that of the Example can also be obtained via the selection of the grain diameter of the abrasive grains dispersed in or carried on the abrasive.

Accordingly, when a relatively rough surface is required with respect to the paste properties being employed, etc., it is possible to comply with this by roughening the granularity of the abrasive grains dispersed within or carried on the abrasive. A metal mask with a relatively rough surface can be produced via the employment of a rough abrasive, for example, #1000 (average grain diameter: 12 µm) or less.

By employing abrasive grains with a relatively large grain diameter like this, the surface of the metal mask can be roughened. However, because this type of metal mask surface roughness to be obtained via the accumulation of the unidirectionally formed stripe-shaped cutting indentations described above, problems such as degradation, changes in properties, or hardening, etc., as a result of not being able to remove the solder paste or ink paste applied because of random irregularities formed via the sandblasting described in the Related Art, can be prevented, for example, by having the direction of movement of the squeegee be the direction of the formation of cutting indentations.

Comparative Example

On the contrary, in printing employing the metal mask of the Comparative Example, because the metal mask has a wavy shape, the shapes of the openings are likewise deformed in response to this wavy shape, which in turn causes the printed image to also be deformed in response to this deformation in the shape of the openings, so that ultimately, the printing quality itself is reduced.

Thus the broadest claims that follow are not directed to a machine that is configured in a specific way. Instead, said broadest claims are intended to protect the heart or essence of this breakthrough invention. This invention is clearly new and useful. Moreover, it was not obvious to those of ordinary skill in the art at the time it was made, in view of the prior art when considered as a whole.

Moreover, in view of the revolutionary nature of this invention, it is clearly a pioneering invention. As such, the claims that follow are entitled to very broad interpretation so as to protect the heart of this invention, as a matter of law.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described;

What is claimed is:

1. A method for producing a metal mask for screen printing, comprising the steps of:
    forming an opening by irradiating a laser beam at predetermined positions on a surface at one side of a metal plate, such that the metal plate is melted at positions irradiated by the laser beam, to form openings passing through a thickness of the metal plate; and
    ejecting an abrasive onto the other surface of the metal plate after the openings are formed, wherein
    the abrasive ejected in the step of ejecting the abrasive is formed into a plate shape having a flat surface, with a maximum diameter of the flat surface thereof being in a range of 0.05 mm to 10 mm, and 1.5 to 20 times as a thickness of a flat shape thereof, and
    the abrasive with the flat shape is ejected at an incident angle of equal to or less than 80 degrees with respect to the other surface of the metal plate, and, at an ejection pressure of 0.01 MPa to 0.7 MPa or at an ejection speed of 5 m/sec to 150 m/sec, such that the ejected abrasive is slid along the other surface of the metal plate.

2. The method for producing a metal mask for screen printing according to claim 1, wherein the abrasive comprises a plate-shaped carrier having flat surfaces, and an abrasive grain carried on at least one of the flat surfaces of the carrier.

3. The method for producing a metal mask for screen printing according to claim 2, wherein the carrier of the abrasive is paper.

4. The method for producing a metal mask for screen printing according to claim 2, wherein the abrasive has a structure in which the abrasive grain is carried on the carrier via an adhesive.

5. The method for producing a metal mask for screen printing according to claim 3, wherein the abrasive has a structure in which the abrasive grain is carried on the carrier via an adhesive.

6. The method for producing a metal mask for screen printing according to claim 1, wherein the abrasive comprises a carrier formed into a plate shape having flat surfaces, and the abrasive grain dispersed within the carrier.

7. The method for producing a metal mask for screen printing according to claim 6, wherein the carrier of the abrasive is an elastic body.

8. The method for producing a metal mask for screen printing according to claim 2, wherein the surface of the metal plate is cut in a stripe shape by the abrasive grain carried on the abrasive, via the sliding of the abrasive along the surface of the metal plate, to form a desired surface roughness on the surface of the metal plate from an accumulation of the stripe-shaped cutting indentations.

9. The method for producing a metal mask for screen printing according to claim 3, wherein the surface of the metal plate is cut in a stripe shape by the abrasive grain carried on the abrasive, via the sliding of the abrasive along the surface of the metal plate, to form a desired surface roughness on the surface of the metal plate from an accumulation of the stripe-shaped cutting indentations.

10. The method for producing a metal mask for screen printing according to claim 4, wherein the surface of the metal plate is cut in a stripe shape by the abrasive grain carried on the abrasive, via the sliding of the abrasive along the surface of the metal plate, to form a desired surface roughness on the surface of the metal plate from an accumulation of the stripe-shaped cutting indentations.

11. The method for producing a metal mask for screen printing according to claim 5, wherein the surface of the metal plate is cut in a stripe shape by the abrasive grain carried on the abrasive, via the sliding of the abrasive along the surface of the metal plate, to form a desired surface roughness on the surface of the metal plate from an accumulation of the stripe-shaped cutting indentations.

12. The method for producing a metal mask for screen printing according to claim 6, wherein the surface of the metal plate is cut in a stripe shape by the abrasive grain carried on the abrasive, via the sliding of the abrasive along the surface of the metal plate, to form a desired surface roughness on the surface of the metal plate from an accumulation of the stripe-shaped cutting indentations.

13. The method for producing a metal mask for screen printing according to claim 7, wherein the surface of the metal plate is cut in a stripe shape by the abrasive grain carried on the abrasive, via the sliding of the abrasive along the surface of the metal plate, to form a desired surface roughness on the surface of the metal plate from an accumulation of the stripe-shaped cutting indentations.

14. A method for producing a metal mask for screen printing, comprising the steps of:
    forming an opening by irradiating a laser beam at predetermined positions on a surface at one side of a metal plate, such that the metal plate is melted at positions irradiated by the laser beam, and to form openings passing through a thickness of the metal plate; and ejecting an abrasive onto the other surface of the metal plate after the openings are formed, wherein the abrasive ejected in the step of ejecting the abrasive is an elastically deformable abrasive in which an abrasive grain having an average grain diameter of 1 mm to 0.1 µm is dispersed or carried, and the elastically deformable abrasive is ejected at an incident angle of equal to or less than 80 degrees with respect to the other surface of the metal plate, and at an ejection pressure of 0.01 MPa to 0.7 MPa or at an ejection speed of 5 m/sec to 150 m/sec, such that the ejected abrasive is slid along the other surface of the metal plate.

15. The method for producing a metal mask for screen printing according claim 14, wherein the surface of the metal plate is cut in a stripe shape by the abrasive grain dispersed in or carried on the abrasive, via the sliding of the abrasive along the surface of the metal plate, to form a desired surface roughness on the surface of the metal plate from an accumulation of these stripe-shaped cutting indentations.

16. The method for producing a metal mask for screen printing according claim 14, wherein the abrasive has a structure in which the abrasive grain is carried on the surface of the carrier, which is an elastic material.

17. The method for producing a metal mask for screen printing according claim 14, wherein the abrasive has a structure in which the abrasive grain is dispersed within the carrier, which has elasticity.

* * * * *